US010522201B2

(12) United States Patent
Haldar

(10) Patent No.: US 10,522,201 B2
(45) Date of Patent: Dec. 31, 2019

(54) METHODS AND SYSTEMS FOR SERIAL MEMORY DEVICE CONTROL

(71) Applicant: QUALCOMM Incorporated, San Diego, CA (US)

(72) Inventor: Kishalay Haldar, Bangalore (IN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/993,926

(22) Filed: May 31, 2018

(65) Prior Publication Data

US 2019/0371373 A1    Dec. 5, 2019

(51) Int. Cl.
*G11C 7/00* (2006.01)
*G11C 7/10* (2006.01)
*G11C 7/22* (2006.01)

(52) U.S. Cl.
CPC .......... *G11C 7/1063* (2013.01); *G11C 7/1015* (2013.01); *G11C 7/222* (2013.01)

(58) Field of Classification Search
CPC ........... G11C 16/10; G11C 16/32; G11C 7/22; G11C 7/1078; G11C 7/1093; G11C 14/0018; G11C 16/0483; G11C 16/28; G11C 7/1045; G11C 7/20; G11C 16/06; G11C 16/20; G11C 5/14
USPC ........... 365/233.1, 191, 226, 185.18, 233.11, 365/233.12, 183, 185.2, 185.21, 189.02, 365/189.05, 189.07, 195
See application file for complete search history.

(56) References Cited

U.S. PATENT DOCUMENTS

| | | | |
|---|---|---|---|
| 2004/0057297 A1 | 3/2004 | Jang et al. | |
| 2010/0162953 A1* | 7/2010 | Hayashi | B05C 1/025 118/697 |
| 2011/0264846 A1 | 10/2011 | Oh | |
| 2013/0117499 A1* | 5/2013 | Shao | G11C 16/22 711/103 |
| 2014/0095764 A1* | 4/2014 | Schumacher | G06F 12/0246 711/103 |
| 2018/0024763 A1* | 1/2018 | Kodera | G06F 3/0622 711/163 |
| 2018/0052639 A1 | 2/2018 | Woo et al. | |

OTHER PUBLICATIONS

International Search Report and Written Opinion—PCT/US2019/029110—ISA/EPO—dated Jul. 25, 2019.

\* cited by examiner

*Primary Examiner* — Thong Q Le
(74) *Attorney, Agent, or Firm* — Patterson & Sheridan, L.L.P.

(57) ABSTRACT

Aspects of the present disclosure relate to systems and methods for determining a state of a serial memory device. Certain embodiments provide a method of determining a state of a serial memory device. The method includes enabling the serial memory device using a first signal. The method further includes receiving a flag indicating a state of the serial memory device based on the enabling of the serial memory device using the first signal.

20 Claims, 4 Drawing Sheets

METHODS AND SYSTEMS FOR SERIAL MEMORY DEVICE CONTROL

INTRODUCTION

Aspects of the present disclosure relate to serial memory devices, and in particular to systems and methods for determining serial memory device status.

One type of memory device is a flash memory. Flash memory is a non-volatile computer storage chip that can be electrically erased and reprogrammed. NAND flash memory (also referred to as a "NAND memory device" or simply "NAND") is a high density type of read-write memory that may be programmed and read in blocks or pages. Single-level cell (SLC) NAND flash memory is an example of a type of flash memory that may be suitable for high-performance, high-endurance, and low-power small form-factor applications (e.g., for Internet of Things (IoT) devices). NAND memory devices are used in memory cards, USB flash drives, solid-state drives, and similar products, for general storage and transfer of data, as well as to store configuration data in numerous digital devices including computing devices. A property of NAND is that all or part of the data image stored therein can be rewritten and thus updated. As used herein, the term "data image" refers to the information stored in one or more memory cells of a NAND.

NAND are typically organized into a number of blocks, with each block consisting of a number of pages. A "block" as it relates to flash memory, and particularly NAND, includes a sequence of storage bytes or bits, having a nominal length. That length is referred to as the block size. The process of storing data into blocks is normally accomplished a whole page at a time, while erasing data is done in units of blocks.

NAND flash memory devices may be interfaced by other devices (e.g., system-on-chip (SoC) devices, IoT devices, computing devices, etc.) that utilize the NAND flash memory devices for data storage. For example, the other devices may use a memory controller to interface with the NAND flash memory device. The memory controller may interface and communicate with the NAND flash memory according to a standardized interface format, such as according to the Open NAND Flash Interface (ONFI) standard (e.g., ONFI 1.0). Accordingly, both the memory controller and NAND flash memory device may follow the same interface standard for communication.

In certain aspects, a NAND flash memory device and memory controller may communicate using a parallel interface. Such a NAND flash memory device that uses a parallel interface for communication may be referred to as a parallel NAND device. The parallel interface may include a large number of pins (e.g., 13-pins) on the NAND flash memory device and memory controller that are interconnected (e.g., by wires, lines, traces, conductors, etc.). Accordingly, different signals can be passed over the large number of pins in parallel for the NAND flash memory device to communicate with the memory controller. For ease of reference, the connections between a NAND flash memory device and a memory controller may be referred to in terms of "pins".

However, the large number of pins used for a parallel interface may not be well suited for certain scenarios that utilize NAND flash memory. For example, IoT devices are becoming more ubiquitous in the marketplace. IoT devices may include different devices embedded with electronics, software, sensors, actuators, and connectivity that enables the devices to communicate with one another and exchange data. Many such IoT devices may need to be small and energy efficient. For example, such IoT devices may need to be small enough to embed or position in many different areas, and may need to be energy efficient as they may need to continuously run on battery power (e.g., for a number of years). If a large number of pins is needed to connect a memory controller to a NAND flash memory device of an IoT device, the size of the IoT device may be compromised to accommodate space (e.g., on-chip space, die space, etc.) for coupling the memory controller to the NAND flash memory device.

Accordingly, in certain aspects, a NAND flash memory device and memory controller may utilize a serial interface for communication. Such a NAND flash memory device that uses a serial interface for communication may be referred to as a serial peripheral interface (SPI) NAND device. An SPI NAND device, accordingly, is an example of a serial memory device. In a SPI NAND device, fewer pins (e.g., 4 or 6) may be used than a parallel NAND device for coupling to a memory controller. Such a SPI NAND device may advantageously use less space for implementation on a device, such as an IoT device. As SPI NAND devices are utilized more, there exists a need for further improvements to SPI NAND devices.

BRIEF SUMMARY

Certain embodiments provide a method of determining a state of a serial memory device. The method includes enabling the serial memory device using a first signal. The method further includes receiving a flag indicating a state of the serial memory device based on the enabling of the serial memory device using the first signal.

Other embodiments provide an electronic device, including a serial memory device and a memory controller. The memory controller is configured to enable the serial memory device using a first signal. The memory controller is further configured to receive a flag indicating a state of the serial memory device based on the enabling of the serial memory device using the first signal.

Other embodiments provide a non-transitory, computer-readable medium comprising instructions that, when executed by a processor of an electronic device, cause the electronic device to perform a method of determining a state of a serial memory device. The method includes enabling the serial memory device using a first signal. The method further includes receiving a flag indicating a state of the serial memory device based on the enabling of the serial memory device using the first signal.

The following description and the related drawings set forth in detail certain illustrative features of one or more embodiments.

BRIEF DESCRIPTION OF THE DRAWINGS

The appended figures depict certain aspects of the one or more embodiments and are therefore not to be considered limiting of the scope of this disclosure.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Aspects of the present disclosure provide methods and apparatuses for controlling serial memory devices, and in particular to systems and methods for determining a status of a serial memory device status.

The following description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

Although certain teachings of this disclosure are illustrated in terms of a SPI NAND device as an example serial memory device, the teachings are applicable in other areas, such as to other serial memory devices. The teachings disclosed should not be construed to be limited to SPI NAND devices or the illustrated embodiments. The illustrated embodiments are merely vehicles to describe and illustrate examples of the inventive teachings disclosed herein.

Figure 1:
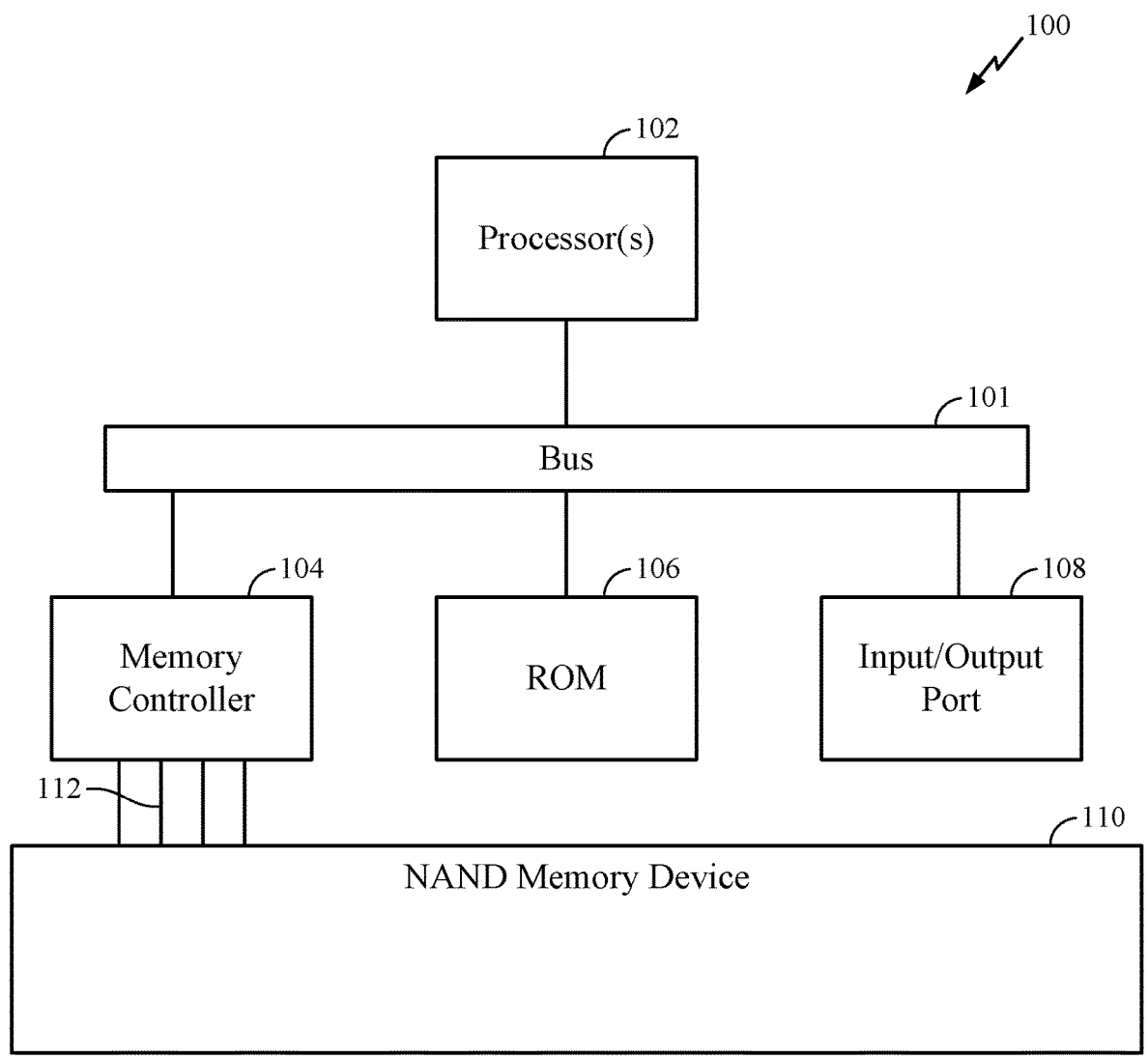
FIG. 1 illustrates a block diagram of a computing device including a SPI NAND memory device in accordance with aspects disclosed herein.

FIG. 1 illustrates a block diagram of a computing device 100 (e.g., IoT device) including a SPI NAND memory device 110 in accordance with aspects disclosed herein. The computing device 100 may include a system bus 101 that allows processor(s) 102, read-only memory (ROM) 106, one or more input/output ports 108 and memory controller 104 to communicate. Additionally, a SPI NAND memory device 110 may be configured to interface with system bus 101 through the memory controller 104. The computing device 100 may include other components not illustrated, such as display/output devices, networking devices, or sensors. Also, the computing device 100 may be implemented on a single computer chip or as a system on chip (SOC).

A SPI NAND memory device 110 may be included in the hardware of computing device 100 as a permanent memory device, or may be removably coupled to the computing device 100 via an interface on the computing device 100. Also, SPI NAND memory device 110 may be implemented as a multi-chip module or on multiple discrete components that may form a chip set and used together. Data may be stored, accessed and read from SPI NAND memory device 110. Additionally, data stored in SPI NAND memory device 110 may be written and erased as appropriate. The memory controller 104 may be incorporated into the SPI NAND memory device 110 as a single chip or as a separate component. In other aspects, memory controller 104 may be separate from SPI NAND memory device 110. The memory controller 104 may be configured to control the NAND memory device 110, such as the process of partitioning data, updating one or more partition tables, reading data, copying data, storing data, and erasing data. There may be a plurality of pins 112 connecting memory controller 104 to SPI NAND memory device 110 as discussed.

Conventionally, for NAND memory devices (e.g., SPI and parallel), a memory controller can issue commands to the NAND memory device to perform the operation issued in the command, such as reset, read, program, erase, etc., which may refer to the command and/or the operation. When receiving the command, the NAND memory device enters a busy state until it completes the requested operation. The duration (e.g., 5 μs, 25 μs, 75 μs, etc.) of the busy state may vary based on the command issued.

While the NAND memory device is in the busy state, it cannot perform additional memory array related operations. In particular, in certain standards, such as ONFI, the memory controller is not allowed to issue commands for memory array related operations (e.g., reset, read, program, erase, etc.) to the NAND memory device while it is in the busy state. Accordingly, in certain aspects, the memory controller needs to be able to determine whether the NAND memory device is in a busy state. If the NAND memory device is in the busy state, the memory controller refrains from issuing memory array related commands to the NAND memory device, such as until the NAND memory device is no longer in the busy state. If the NAND memory device is not in the busy state, the memory controller may issue a memory array related command to the NAND memory device.

In certain aspects, a parallel NAND memory device may be configured to selectively adjust a busy signal on one of the pins (e.g., referred to as a busy pin) of the parallel NAND memory device based on the state of the parallel NAND memory device. For example, if the parallel NAND memory device is in the busy state, the parallel NAND memory device may set the busy signal (e.g., to a negative polarity signal) to indicate the parallel NAND memory device is in a busy state. If the parallel NAND memory device is not in the busy state, the parallel NAND memory device may set the busy signal (e.g., to a positive polarity signal) to indicate the parallel NAND memory device is not in a busy state. For such parallel NAND memory devices, the memory controller may simply determine the state of the parallel NAND memory device by checking the busy signal that is continuously available on the busy pin. For example, the memory controller can simply check the busy signal of a parallel NAND memory device at any given clock cycle for even just a single clock cycle to determine the state of the parallel NAND memory device.

In certain aspects, SPI NAND devices do not have a pin dedicated to carrying a busy signal. Accordingly, other techniques are used for determining the state of SPI NAND devices. In particular, even while in a busy state, a SPI NAND device may be configured to accept a GET FEATURE command from a memory controller. In particular, a GET FEATURE command may not be a memory array related command in that it does not perform on operation on the actual data in the memory array of the SPI NAND device, but rather causes the SPI NAND device to return information about operation of the SPI NAND device, including a state of the SPI NAND device. Therefore, the SPI NAND device is configured to return information regarding the state (e.g., busy or not) of the SPI NAND device in response to the GET FEATURE command. For example, the SPI NAND device returns an operation in progress (OIP) flag, and the value of the OIP flag is indicative of whether an operation is in progress at the SPI NAND device meaning it is busy, or an operation is not in progress at the SPI NAND device meaning it is not busy (e.g., idle).

Figure 2:
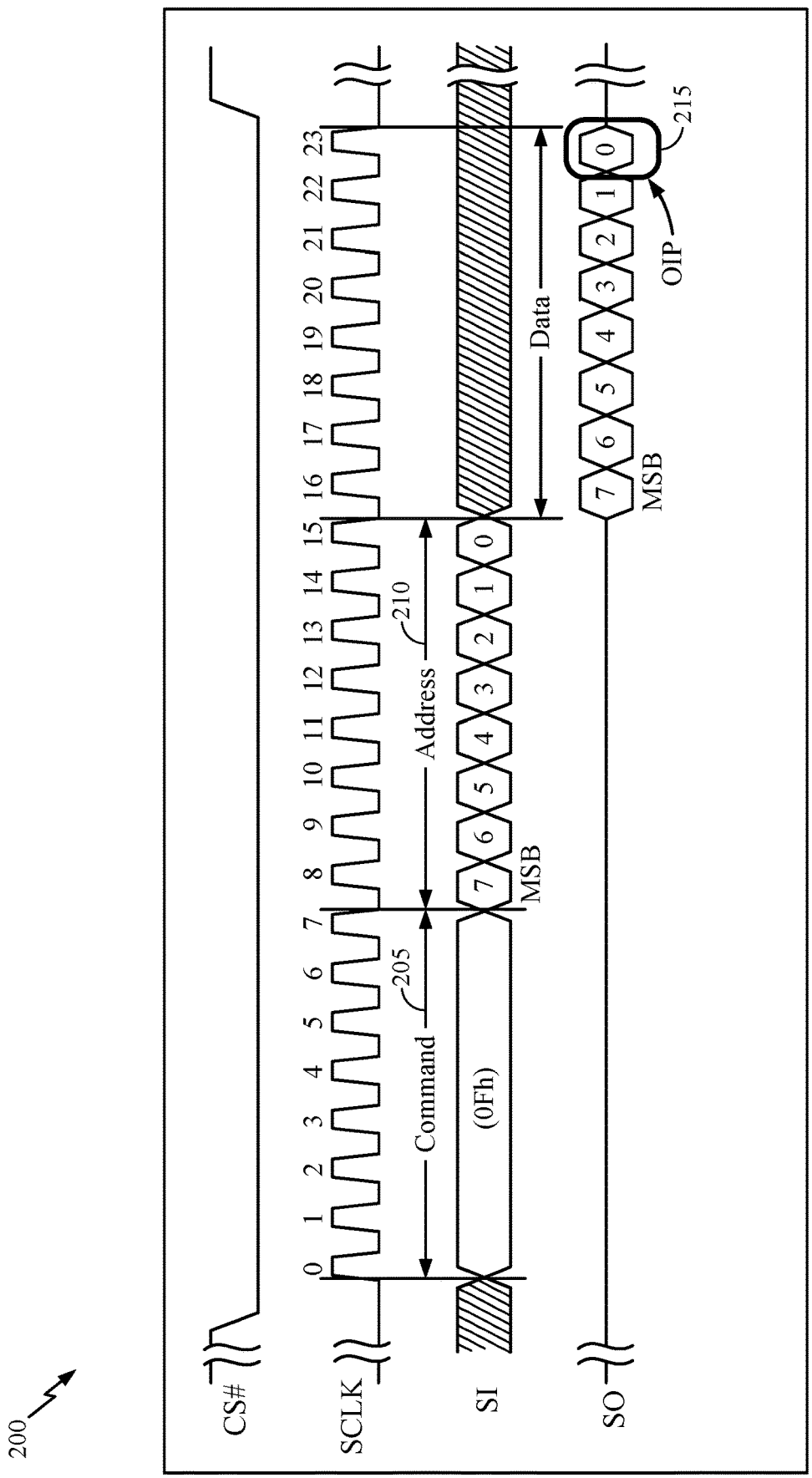
FIG. 2 illustrates an example signal diagram for performance of a GET FEATURE command between a memory controller and SPI NAND device.

FIG. 2 illustrates an example signal diagram 200 for performance of a GET FEATURE command between a memory controller and SPI NAND device. In certain aspects, the signals in signal diagram 200 are generated by and passed between a memory controller (e.g., memory controller 104) and a SPI NAND device (e.g., SPI NAND device 110) over pins of the SPI NAND device.

Signal diagram 200 illustrates four separate signals, a chip select signal (CS#), a serial clock signal (SCLK), a slave output signal (SO) (e.g., a master input slave output (MISO) signal), and a slave input signal (SI) (e.g., a master output slave input (MOSI) signal). Accordingly, in certain aspects, signal diagram 200 is indicative of a 4-pin SPI NAND device, each of the 4-pins carrying a different one of the signals between the memory controller 104 and the SPI NAND device 110.

The CS# signal may be driven/controlled by the memory controller 104. The CS# signal may be used by the memory controller 104 to select/enable control of the SPI NAND device 110. In certain aspects, the memory controller 104 may be coupled to and control multiple slave devices, such as the SPI NAND device 110, and utilizes the CS# signal to enable control of one of the slave devices at a time. In particular, in certain aspects, the memory controller 104 may have separate connections to the pin on each slave device configured to carry the CS# signal. Therefore, each slave device can receive a different CS# signal from memory controller 104. Further, each of the memory controller 104 and the slave devices may use shared connections for each of the SCLK signal, SO signal, and SI signal. For example, the memory controller 104 may have one shared connection to each of the pins carrying the SCLK signal for the multiple slave devices, another shared connection to each of the pins carrying the SO signal for the multiple slave devices, and another shared connection to each of the pins carrying the SI signal for the multiple slave devices. In certain aspects, only the one slave device, such as SPI NAND device 110, enabled by the corresponding CS# signal at a time acts on the SCLK, SO, and SI signals from the memory controller 104, while any slave devices not enabled ignore these signals.

In particular, the CS# signal for a SPI NAND device 110 may be set to a first value/disabled (e.g., high, such as to a positive polarity signal) by the memory controller 104 when the SPI NAND device 110 is not enabled. Further, the CS# signal for a SPI NAND device 110 may be set to a second value/enabled (e.g., low, such as to a negative polarity signal) by the memory controller 104 when the SPI NAND device 110 is enabled.

The SCLK signal may be driven/controlled by the memory controller 104. The SCLK signal is a clock signal used by the memory controller 104 and/or SPI NAND device 110 for performing operations based on clock cycles of the clock signal. In certain aspects, the memory controller 104 only drives/enables the clock signal when it enables a SPI NAND device 110 (or other slave device) using a corresponding CS# signal. When no SPI NAND device 110 (or other slave device) is enabled, the memory controller 104 may not drive/may disable the clock signal (e.g., leaves it at low or high, without cycling/toggling as a clock signal).

The SI signal may be driven/controlled by the memory controller 104. The SI signal may be used by the memory controller 104 to send data/information (e.g., commands, addresses, data to be written, etc.) from the memory controller 104 (e.g., the master device) to the SPI NAND device 110 (e.g., the slave device).

The SO signal may be driven/controlled by the SPI NAND device 110. The SO signal may be used by the SPI NAND device 110 to send data/information (e.g., data that is read, status information of the SPI NAND device 110, etc.) from the SPI NAND device 110 to the memory controller 104.

It should be noted that though certain aspects are described with respect to a 4-pin SPI NAND device design, the techniques discussed herein may also be used with SPI NAND devices with a different number of pins. For example, certain aspects discussed herein may be used with a 6-pin SPI NAND device design. A 6-pin SPI NAND device may utilize the same CS# and SCLK signals as the 4-pin SPI NAND device design. Accordingly, 2-pins may be utilized in the same manner in both the 4-pin and 6-pin SPI NAND device design. In certain aspects, one of the remaining 4 pins of the 6-pin SPI NAND device design may be used for the SI signal and for an SO signal. In particular, only one of the SPI NAND device 110 may be communicating data to the memory controller 104 or the memory controller 104 may be communicating data to the SPI NAND device 110 at a time, meaning that only one of a SI signal or SO signal is sent a time. Therefore, one pin can share carrying of the SI signal and the SO signal. In certain aspects, the remaining 3 pins of the 6-pin SPI NAND device are used to carry SO signals. Accordingly, 4 pins at a time in the 6-pin SPI NAND device can carry SO signals in parallel so that data can be transferred more quickly from the SPI NAND device to the memory controller.

As discussed, in certain aspects the memory controller 104 is configured to determine a state (e.g., busy or not) of the SPI NAND device 110. Signal diagram 200 indicates one conventional method of issuing a GET FEATURE command by the memory controller 104 to determine a state of the SPI NAND device 110.

As shown, memory controller 104 first enables the SPI NAND device 110 by enabling the CS# signal associated with the SPI NAND device 110. Based on enabling the CS# signal, the memory controller 104 enables the SCLK signal. At the rise of the clock cycle 0, the memory controller 104 initiates issuing a GET FEATURE command 205 on the SI signal. In particular, the memory controller 104 may toggle the SI signal over 8 clock cycles (e.g., cycle 0 to cycle 7) to issue a bit stream (e.g., 0 Fh) corresponding to the GET FEATURE command 205. After issuing the GET FEATURE command 205, the memory controller 104 may initiate issuing an address 210 (e.g., of a location in a memory array of the SPI NAND device 110) corresponding to the command on the SI signal. In particular, the memory controller 104 may toggle the SI signal over 8 clock cycles (e.g., cycle 8 to cycle 15) to issue a bit stream corresponding to the address 210. Though the GET FEATURE command may not use an address, an address may be sent anyway according to the interface standard between the memory controller 104 and the SPI NAND device 110.

The SPI NAND device 110, based on receiving the GET FEATURE command 205 is configured to send information to the memory controller 104 on the SO signal as discussed, including sending an OIP flag 215. In particular, the SPI NAND device 110 may toggle the SO signal over 8 clock cycles (e.g., cycle 16 to cycle 23) to issue a bit stream corresponding to the information. The last bit (e.g., $8^{th}$ bit corresponding to cycle 23) of the bit stream may correspond to the OIP flag 215. In certain aspects, after the SPI NAND device 110 sends the information over the SO signal, the memory controller 104 disables the CS# signal and the SCLK signal.

Accordingly, based on signal diagram 200, the memory controller 104 may spend 24 clock cycles in order to receive the OIP flag and determine the status of the SPI NAND device 110. During each clock cycle, additional power is consumed for communication between the memory controller 104 and SPI NAND device 110, such as power for: finite state machines (FSMs), buses for passing signals, pads that connect the memory controller 104 and/or SPI NAND device 110 to a substrate, device interface logic (e.g., of a device 100), etc. Therefore, since a large number of clock cycles are used for determining the status, a large amount of power is consumed.

In addition, as discussed, an SPI NAND device 110 may be in a busy state for a long period of time (e.g., 5 µs, 25 µs, 75 µs, etc.) and the memory controller 104 may need to repeatedly (e.g., periodically) check the status of the SPI NAND device 110 during this time period to determine when the SPI NAND device 110 is no longer in the busy state. Therefore, the fact that 24 clock cycles are expended to determine the status of the SPI NAND device 110 multiple times further exacerbates the power consumption issue.

Therefore, conventional techniques for determining a state of a SPI NAND device 110 that use the signaling of signal diagram 200 may be power inefficient. For example, the techniques may not be suitable for IoT devices.

Certain aspects herein related to systems and methods for determining a state of a SPI NAND device or other serial memory device that are more power efficient than conventional techniques. In particular, in certain aspects, the systems and methods reduce the number of clock cycles spent by a memory controller to determine the status of the SPI NAND device. By spending fewer clock cycles, the power efficiency for determining the status of the SPI NAND device is improved, and therefore the overall power efficiency of a device, such as device 100 including the SPI NAND device is improved. This may be especially advantageous for circumstances where power efficiency is a key performance indicator, such as in IoT devices.

As discussed, connections for carrying the SO signal to the memory controller 104 may be shared by multiple slave devices. Accordingly, only one slave device, such as SPI NAND device 110, may be allowed to drive/send a SO signal at a time. Further, as shown in signal diagram 200, the SPI NAND device 110 does not drive the SO signal while the memory controller 104 is issuing the GET FEATURE COMMAND and address. However, the SO signal is also not being driven during this time by another slave device, so the SPI NAND device 110 could drive the SO signal during this time period. In addition, if the CS# signal is disabled/de-asserted by the memory controller 104 before completion of sending a command and address, the SPI NAND device 110 is configured to treat the disabling of the CS# signal as an incomplete command and return without malfunctioning (e.g., return to an idle/not busy state). Based on this, certain aspects herein relate to a SPI NAND device configured to drive the SO signal with information (e.g., 1 bit, a signal level, etc.) indicating a state (e.g., busy or idle) of the SPI NAND device when it is enabled by the CS# signal during at least a portion of a time period used by the memory controller 104 to issue a command and/or address.

In certain aspects, the SPI NAND device is configured to drive the SO signal with the information for one clock cycle starting at the first clock cycle the CS# signal is enabled. In other aspects, the SPI NAND device is configured to drive the SO signal with the information for multiple clock cycles (e.g., anywhere from 1 to 16) starting at any suitable clock cycle (e.g., clock cycle 0 to clock cycle 15) during at least a portion of a time period used by the memory controller 104 to issue a command and/or address.

Figure 3:
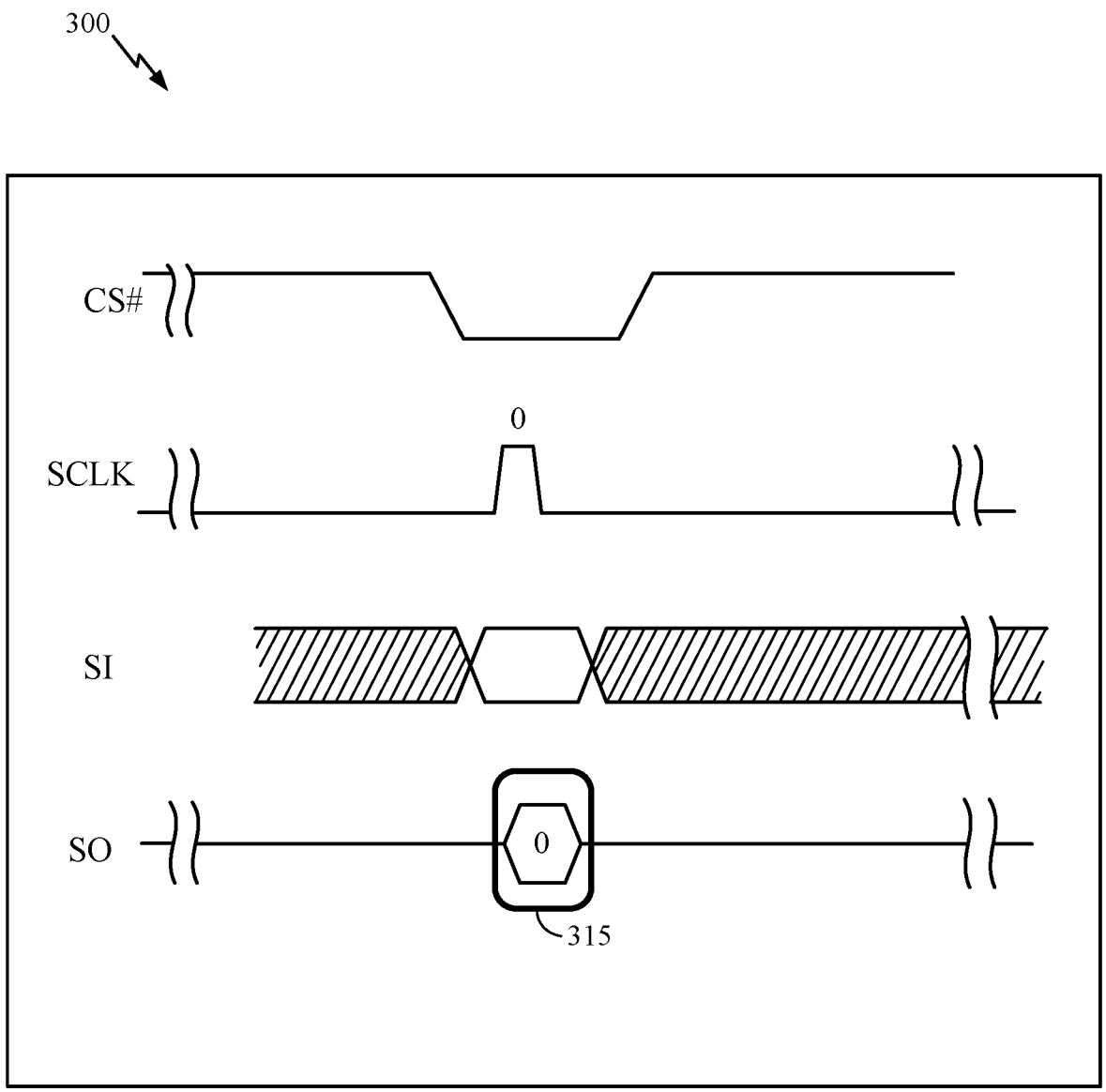
FIG. 3 illustrates an example signal diagram for performance of a GET FEATURE command between a memory controller and SPI NAND device in accordance with aspects disclosed herein.

FIG. 3 illustrates an example signal diagram 300 for performance of a GET FEATURE command between a memory controller and SPI NAND device in accordance with aspects disclosed herein. In certain aspects, the signals in signal diagram 300 are generated by and passed between a memory controller (e.g., memory controller 104) and a SPI NAND device (e.g., SPI NAND device 110) over pins of the SPI NAND device.

As shown, memory controller 104 first enables the SPI NAND device 110 by enabling the CS# signal associated with the SPI NAND device 110. Based on enabling the CS# signal, the memory controller 104 enables the SCLK signal. At a same clock cycle that the CS# signal is enabled (e.g., the first clock cycle, clock cycle 0 (e.g., at the rising edge, falling edge, etc.)), based on receiving the enabled CS# signal, the SPI NAND device 110 is configured to send information to the memory controller 104 on the SO signal indicating a state of the SPI NAND device 110. For example, the SPI NAND device 110 is configured to drive the SO signal with a flag 315 (e.g., 1-bit the value of which is indicated by whether the SO signal is high (e.g., a positive polarity signal) or low (e.g., a negative polarity signal)) at clock cycle 0 that indicates a status (e.g., busy or idle) of the SPI NAND device 110, similar to the OIP flag 215 of FIG. 2. The flag 315 may be referred to as an OIP flag, ready (RDY) flag, etc. The memory controller 104 can sense the SO signal and determine the state of the SPI NAND device 110 based on the flag 315.

In certain aspects, the SPI NAND device 110 drives the SO signal with the flag 315 during any command and/or address cycle, regardless of the command and/or address driven on the SI signal by the memory controller 104.

In certain aspects, the memory controller 104 disables/de-asserts the CS# signal after the flag 315 is signaled (e.g., after the first clock cycle, clock cycle 0). Accordingly, the memory controller 104 disables the SCLK signal (e.g., after clock cycle 0). The SPI NAND device 110, based on the CS# signal being asserted for less than the number of cycles (e.g., asserted for only 1 cycle) needed to signal the command and address on the SI signal, treats the assertion of the CS# signal as an incomplete command and returns to idle.

Based on signal diagram 300, the memory controller 104 may spend only 1 clock cycle (or in other embodiments 16 or fewer clock cycles) in order to receive flag 315 and determine the status of the SPI NAND device 110. This results an up to 24× power reduction as compared to the use of the GET FEATURE command, thereby greatly reducing power consumption. Further, a finite state machine of the memory controller 104 can remain in a single state (waiting for the flag 315 to indicate the SPI NAND device 110 is idle/ready) when the SPI NAND device 110 is in a busy state as it does not need to change states (e.g., change the state of gates) to send command and address information. This further reduces power consumption to determine the status of the SPI NAND device 110.

In addition, the SPI NAND device 110 itself saves power by not having to engage its finite state machine to decode incoming commands and deliver status information. For example, in certain aspects, the SPI NAND device 110 may be configured to drive the flag 315 on the SO signal using a simple multiplexer. In particular, the multiplexer may have as inputs the CS# signal and the state of the SPI NAND device 110. When the CS# signal is received, the multiplexer may be configured to output the state of the SPI NAND device 110 on the SO signal.

Figure 4:
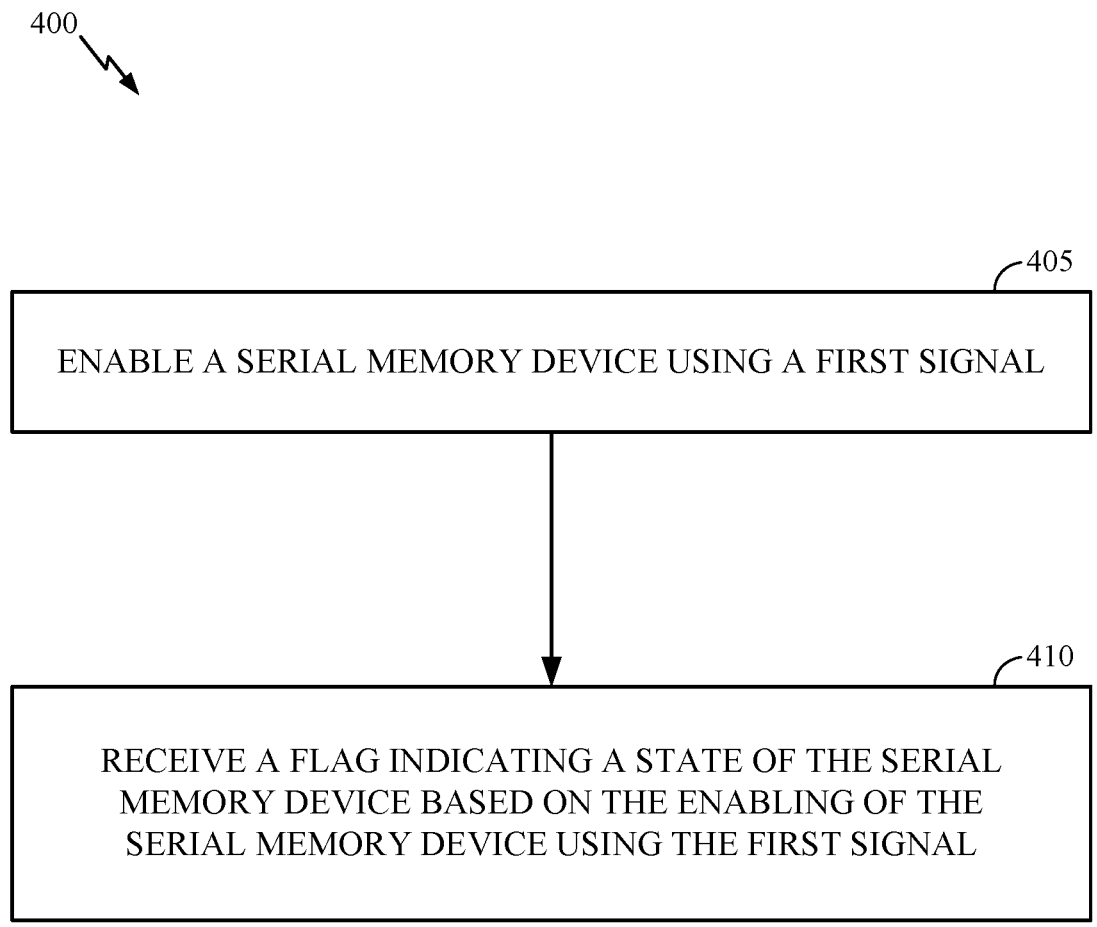
FIG. 4 is a flow chart that illustrates example operations for determining a state of a serial memory device, in accordance with certain aspects of the present disclosure.

FIG. 4 is a flow chart that illustrates example operations for determining a state of a serial memory device, in accordance with certain aspects of the present disclosure. For example, the steps of operations of FIG. 4 may be performed by the memory controller 104 and/or SPI NAND device 110, or another suitable circuit.

At step 405, the serial memory device is enabled using a first signal. For example, the memory controller 104 asserts the CS# signal to enable the SPI NAND device 110 and the CS# signal is the first signal. In another example, the memory controller 104 asserts the SCLK signal based on the assertion of the CS# signal, and one or more clock cycles of the SCLK signal are the first signal.

At step 410, a flag indicating a state of the serial memory device is received based on the enabling of the serial memory device using the first signal. For example, the SPI NAND device 110 asserts and the memory controller 104 receives the SO signal with a flag indicating a state of the SPI NAND device 110. In certain aspects, the SPI NAND device 110 asserts the flag over a single clock cycle (e.g., the first clock cycle in time that the serial memory device is enabled).

The preceding description is provided to enable any person skilled in the art to practice the various embodiments described herein. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

A processing system may be implemented with a bus architecture. The bus may include any number of interconnecting buses and bridges depending on the specific application of the processing system and the overall design constraints. The bus may link together various circuits including a processor, machine-readable media, and input/output devices, among others. A user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media, such as any medium that facilitates transfer of a computer program from one place to another. The processor may be responsible for managing the bus and general processing, including the execution of software modules stored on the computer-readable storage media. A computer-readable storage medium may be coupled to a processor such that the processor can read information from, and write information to, the storage medium. In the alternative, the storage medium may be integral to the processor. By way of example, the computer-readable media may include a transmission line, a carrier wave modulated by data, and/or a computer readable storage medium with instructions stored thereon separate from the wireless node, all of which may be accessed by the processor through the bus interface. Alternatively, or in addition, the computer-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module, it will be understood that such functionality is implemented by the processor when executing instructions from that software module.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method of determining a state of a serial memory device, comprising:

enabling a serial memory device using a chip select signal; and receiving a flag indicating a state of the serial memory device directly in response to the enabling of the serial memory device using the chip select signal.

2. The method of claim 1, wherein enabling the serial memory device using the chip select signal comprises changing a value of the chip select signal from a first value to a second value, wherein receiving the flag occurs in a same clock cycle that the chip select signal changes from the first value to the second value.

3. The method of claim 2, further comprising enabling a clock signal based on changing the value of the chip select signal from the first value to the second value, wherein the same clock cycle is a clock cycle of the clock signal.

4. The method of claim 2, further comprising disabling the serial memory device using the chip select signal by changing the value of the chip select signal to the first value after receiving the flag.

5. The method of claim 4, wherein the disabling occurs during the same clock cycle.

6. The method of claim 1, wherein the serial memory device comprises a serial peripheral interface NAND memory device.

7. The method of claim 1, wherein the chip select signal is controlled by a memory controller, and wherein the flag is received by the memory controller as part of a slave output signal controlled by the serial memory device.

8. The method of claim 7, wherein receiving the flag occurs independent of information indicated on a slave input signal by the memory controller to the serial memory device.

9. An electronic device, comprising:

a serial memory device; and a memory controller configured to:

enable the serial memory device using a chip select signal; and receive a flag indicating a state of the serial memory device directly in response to the enabling of the serial memory device using the chip select signal.

10. The electronic device of claim 9, wherein to enable the serial memory device using the chip select signal comprises to change a value of the chip select signal from a first value to a second value, wherein to receive the flag occurs in a same clock cycle that the chip select signal changes from the first value to the second value.

11. The electronic device of claim 10, wherein the memory controller is further configured to enable a clock signal based on changing the value of the chip select signal from the first value to the second value, wherein the same clock cycle is a clock cycle of the clock signal.

12. The electronic device of claim 10, wherein the memory controller is further configured to disable the serial memory device using the chip select signal by changing the value of the chip select signal to the first value after receiving the flag.

13. The electronic device of claim 12, wherein the disabling occurs during the same clock cycle.

14. The electronic device of claim 9, wherein the serial memory device comprises a serial peripheral interface NAND memory device.

15. The electronic device of claim 9, wherein the chip select signal is controlled by a memory controller, and wherein the flag is received by the memory controller as part of a slave output signal controlled by the serial memory device.

16. The electronic device of claim 15, wherein to receive the flag occurs independent of information indicated on a slave input signal by the memory controller to the serial memory device.

17. A non-transitory, computer-readable medium comprising instructions that, when executed by a processor of an electronic device, cause the electronic device to perform a method of determining a state of a serial memory device, the method comprising:
- enabling a serial memory device using a chip select signal; and
- receiving a flag indicating a state of the serial memory device directly in response to the enabling of the serial memory device using the chip select signal.

18. The non-transitory, computer-readable medium of claim 17, wherein enabling the serial memory device using the chip select signal comprises changing a value of the chip select signal from a first value to a second value, wherein receiving the flag occurs in a same clock cycle that the chip select signal changes from the first value to the second value.

19. The non-transitory, computer-readable medium of claim 18, wherein the method further comprises enabling a clock signal based on changing the value of the chip select signal from the first value to the second value, wherein the same clock cycle is a clock cycle of the clock signal.

20. The non-transitory, computer-readable medium of claim 18, wherein the method further comprises disabling the serial memory device using the chip select signal by changing the value of the chip select signal to the first value after receiving the flag.

* * * * *